US005559084A

United States Patent [19]
Vandersande et al.

[11] Patent Number: 5,559,084
[45] Date of Patent: Sep. 24, 1996

[54] SUPERCONDUCTING 2-4-7 OXIDES

[75] Inventors: John B. Vandersande, Newbury; Gregory J. Yurek, Wellesley, both of Mass.; Toshihiro Kogure, Tsukuba, Japan

[73] Assignee: Massachusetts Institute of Technology, Cambridge, Mass.

[21] Appl. No.: 659,410

[22] Filed: May 28, 1991

[51] Int. Cl.$^6$ .................... C04B 35/505; C04B 35/622; H01L 39/12
[52] U.S. Cl. .................... 505/125; 505/500; 505/725; 505/776; 505/780; 505/779; 252/518; 252/521; 423/593
[58] Field of Search .................... 505/100, 780, 505/779, 785, 125, 500, 725, 776; 252/518, 521; 423/593

[56] References Cited

U.S. PATENT DOCUMENTS

| | | | |
|---|---|---|---|
| 4,826,808 | 5/1989 | Yurek | 505/1 |
| 4,892,861 | 1/1990 | Ray | 505/785 |
| 5,063,202 | 11/1991 | Narayan | 505/1 |
| 5,140,000 | 8/1992 | Tallon | 505/780 |

OTHER PUBLICATIONS

One "The Superconductive Compound of the Ba–Y–Cu Oxide" *Bull. Chem. Soc. Jpn* Notes v.60 1987 p. 3035–3036.
Kogure "Superconducting $Yb_2Ba_4Cu_7O_x$ produced by oxidizing metallic . . ." *Physica C v. 156* Aug. 1988 p. 45–46.
Umarji "Effect of nominal copper concentration $YBa_2Cu_{3x}O$ . . ." *Pramana–J. Phys.* v. 29(6) Dec. 1987 pp. 611–614.
Bordet "Structure determination of the new high–temperature . . ." *Nature* v. 334 Aug. 18, 1988 pp. 896–898.
Baba–Kishi "A TEM investigation of yttrium–based superconduct . . ." *Electric Phenomena* v. 109 1988 (Abstracts).

*Primary Examiner*—Paul Lieberman
*Assistant Examiner*—M. Kopec
*Attorney, Agent, or Firm*—Wolf, Greenfield & Sacks, P.C.

[57] ABSTRACT

Disclosed are a composition and a method of preparing a composition of the formula $R_2Q_4Cu_7O_x$, wherein R is a rare-earth ion or a mixture of rare earth ions, and Q is Ba, or Ba combined with either Sr or Ca or both Sr and Ca. Such compositions have a unique crystalline structure and are superconducting oxides.

24 Claims, 9 Drawing Sheets

SUPERCONDUCTING 2-4-7 OXIDES

BACKGROUND OF THE INVENTION

The invention relates to superconducting 2-4-7 oxides and their preparation.

Superconductors are materials which below a certain critical temperature $T_c$ have zero resistance to the flow of electrons. Materials such as $Ba_xLa_{2-x}CuO_4$ and $Sr_xLa_{2-x}CuO_4$ were reported to have $T_c$~40° K., Chu, C. W. et al., 58 Phys. Rev. Lett. 405 (1987). These compounds have the $K_2NiF_4$-type structure in which copper ions are located within pseudosquare planar arrangements of the oxygen ligands. The nominal copper oxidation state for this structure is between 2+ and 3+.

Another superconducting material, $YBa_2Cu_3O_x$, the so-called "1-2-3" compound, has a $T_c$~90° K.; Wu, M. K. et al., 58 Phys. Rev. Lett. 908 (1987). X-ray and neutron diffraction analyses revealed that this material essentially has a perovskite structure in which yttrium and barium ions are ordered in the c-axis direction and distinctive oxygen defects cause an orthorhombic unit cell with a space group Pmmm, see, e.g., Seigrist, S. et al., 35 Phys. Rev. B. 7137 (1987). This structure has two principal groups of Cu ions. In one group, denoted crystallographically as Cu II, the Cu ions are located within square planar or square pyramid oxygen arrangements which generate infinite $[CuO_2]$ planes extending perpendicular to the c-axis on both sides of the yttrium ions. The other Cu ions (Cu I) are located in square oxygen planes, which form $[CuO_3]$ chains in the b-axis direction. The superconducting properties of this compound are influenced sensitively by oxygen stoichiometry. The general consensus is that other defects, particularly twins and grain boundaries, play an important role in its electrical and mechanical properties.

Recently, new compounds were discovered in the Bi-Sr-Ca-Cu-O and Tl-Ba-Ca-Cu-O systems, Maeda, H. et al., 27 Jap. J. Appl. Phys. Lett. (in press) (1988), Sheng, Z. Z. et al, and Hermann, 332 Nature 138 (1988). $T_c$ in these compounds was about 125° K. Structural analyses of these materials revealed several structures and compounds. The difference in $T_c$ between the various compounds can be related to the number of infinite $[CuO_2]$ planes perpendicular to the c-axis. The common features between the 1-2-3 phase and these new superconducting oxides indicates that infinite $[CuO_2]$ planes and an intermediate copper oxidation state between 2+ and 3+ are mainly responsible for the superconducting properties. These ideas are also consistent with the result for the 1-2-3 compound presented by Xiao et al. in 322 Nature 238 (1988).

A derivative structure of the normal 1-2-3 structure has also been identified. This compound, named the "2-4-8" structure, has a $T_c$~80° K., as reported by Marshall et al., Abstracts of Mater. Res. Soc., Spring 1988 Meeting 197 (1988) in thin films having the composition $Y_2Ba_4Cu_8O_x$ and by Kogure et al., 156 Physica C 35 (1988) in oxidized metallic precursors having the composition $Yb_2Ba_4Cu_8O_x$. This structure can be described as having periodic insertions of CuO layers in the normal 1-2-3 structure, which causes double $[Cu_2O_4]$ chains in the b-axis direction.

SUMMARY OF THE INVENTION

In accordance with the invention, novel superconducting compositions and their method of preparation are provided. As embodied and described herein, the invention comprises a superconducting oxide phase having the general formula $R_2Q_4Cu_7O_x$, where R is a rare-earth ion such as Y, La, Eu, Gd, Tb, Dy, Ho, Er, Tm, Yb, or Lu, and Q is at least partly Ba, the balance of which may be Sr or Ca, or both Sr and Ca. This is generally referred to as a "2-4-7" composition according to the general stoichiometric relationship between R, Q and Cu in the novel structure. In a preferred embodiment, R is Yb and Q is Ba, and oxygen ions are present in an amount such that x=15–β where β is in the general range of 0 to about 1.5.

DESCRIPTION OF THE PREFERRED EMBODIMENT

The preferred embodiment of the invention is described in the following example.

Methods used to fabricate melt-spun metal ribbons, known as metallic precursors, are known to those skilled in the art, see, e.g., Hazen, R. M. et al., 60 Phys. Rev. Left. 1657 (1988). Accordingly, a melt-spun ribbon was formed from a starting alloy having the approximate composition $YbBa_2Cu_3$ to which 33 weight percent silver was added. The melt-spun ribbons were oxidized in a furnace with 1 atmosphere of pure oxygen. The ribbons were heated at a rate of 10°–30° C. per minute to 500° C., where they were held for 10 hours. Heating was then resumed at the same rate and continued to 900° C. The ribbons were held at 900° C. for 100 hours, and were were then cooled to ambient temperature at the same rate as they were heated, again holding the temperature at 500° C. for 10 hours.

The oxidized ribbons, typically about 10 mm×1 mm×20 μm in size, were ground to a powder and analyzed by x-ray powder diffraction using monochromated $CuK_\alpha$ radiation. TEM specimens were also prepared by crushing pieces of the ribbons in an agate mortar and pestle, suspending the powder in carbon tetrachloride, and placing the suspension on a holey carbon film supported by a copper grid. The specimens were observed on the same day they were prepared using a JEOL 200 CX transmission electron microscope (200 kV, Cs=2.9 mm) with a $LaB_6$ filament and a side entry double-tilting sample holder.

X-ray diffraction patterns from the samples showed peaks characteristic of Ag, $BaCuO_2$, $Yb_2BaCuO_5$ (2-1-1), and CuO. The patterns also showed unidentified peaks. The unidentified peaks resembled those of the 1-2-3 phase in the higher angle range, suggesting a phase with a structure analogous to the 1-2-3 phase.

Figure 1A:
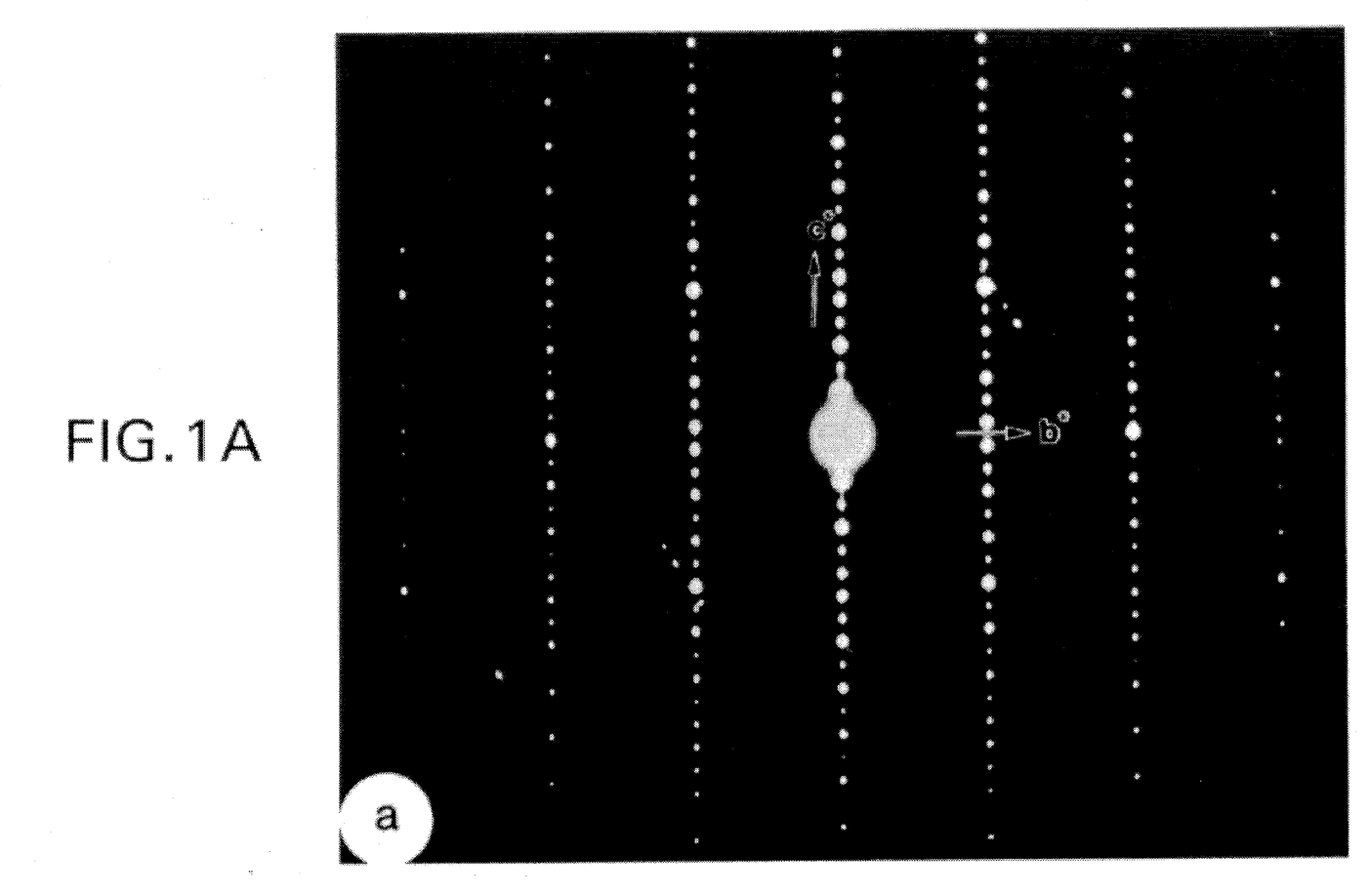
FIGS. 1a and 1b are x-ray diffraction patterns of crystals prepared according to the preferred embodiment below.
Figure 1B:
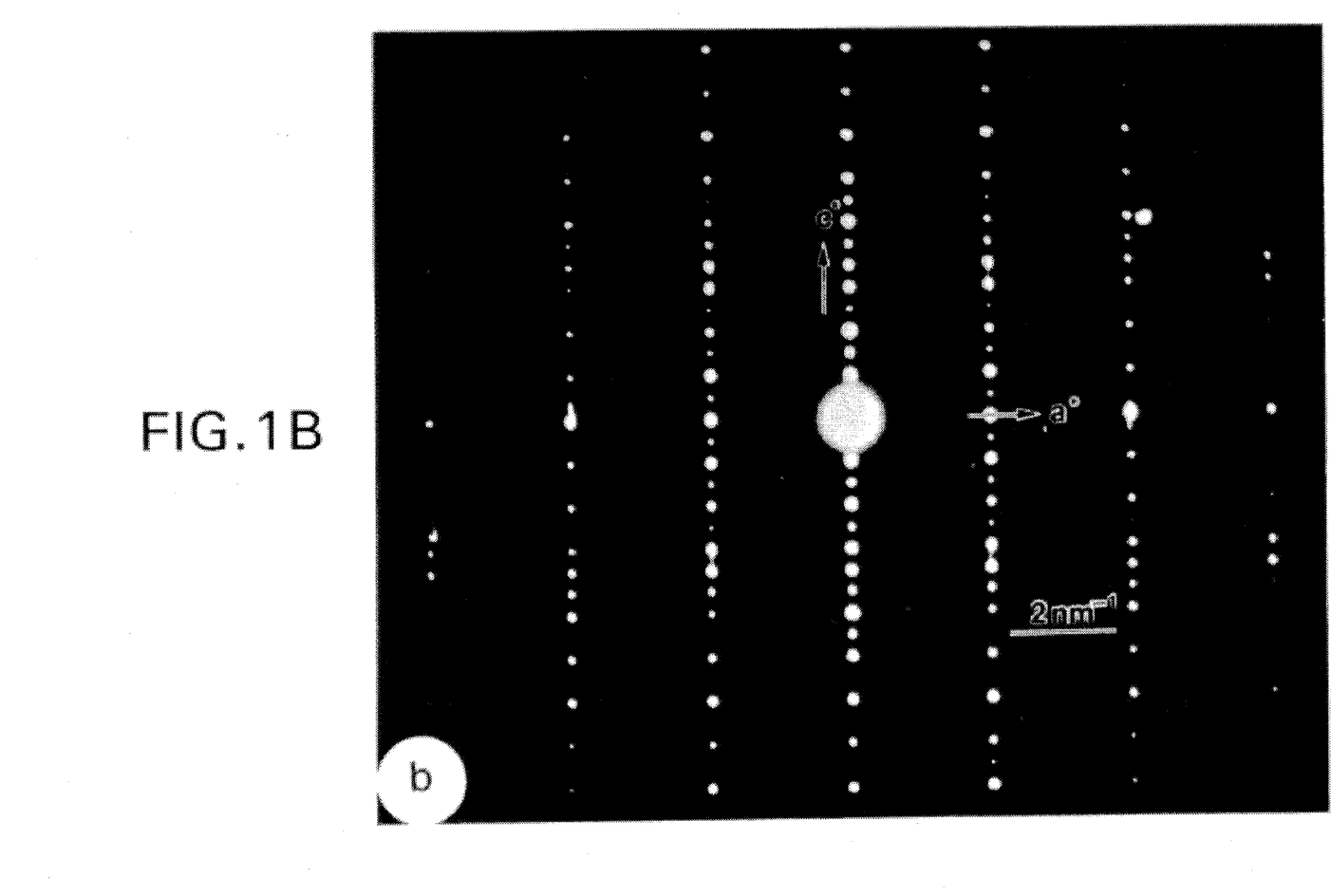

Analysis via electron microscopy revealed that crystals having the x-ray diffraction pattern shown in FIG. 1a and FIG. 1b were common in the specimen. These patterns were easily identified by the high density of reciprocal lattice points on one axis corresponding to a periodicity of about 25.2 Å. FIG. 1a is the pattern of the crystal from the [100] direction and is face-centered, indicating a c-axis periodicity of 2×25.2 Å, or 50.4 Å. FIG. 1b shows the pattern from the [010] direction. FIG. 1a and FIG. 1b indicate that the periods along the a- and b-axes are about 3.8 Å.

Figure 2A:
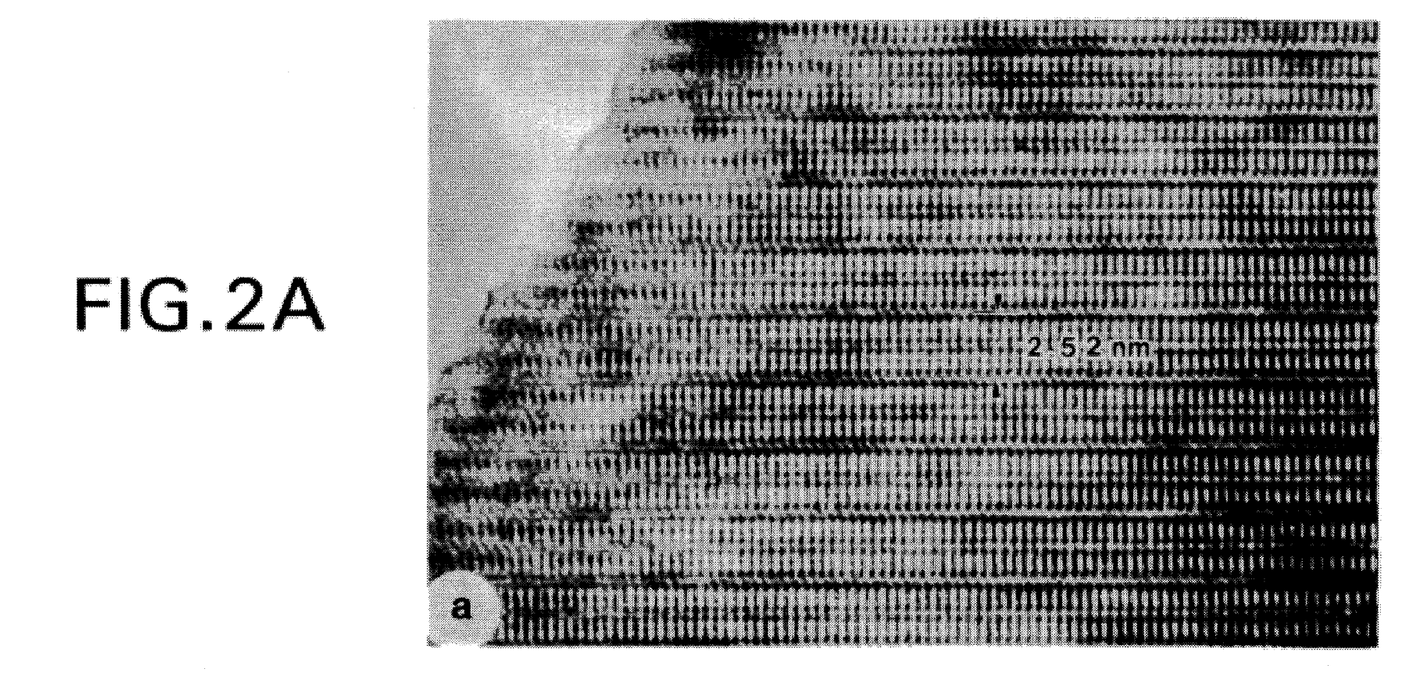
FIGS. 2a and 2b are high resolution electron microscope (HREM) images of $Yb_2Ba_4Cu_7O_x$.
Figure 2B:
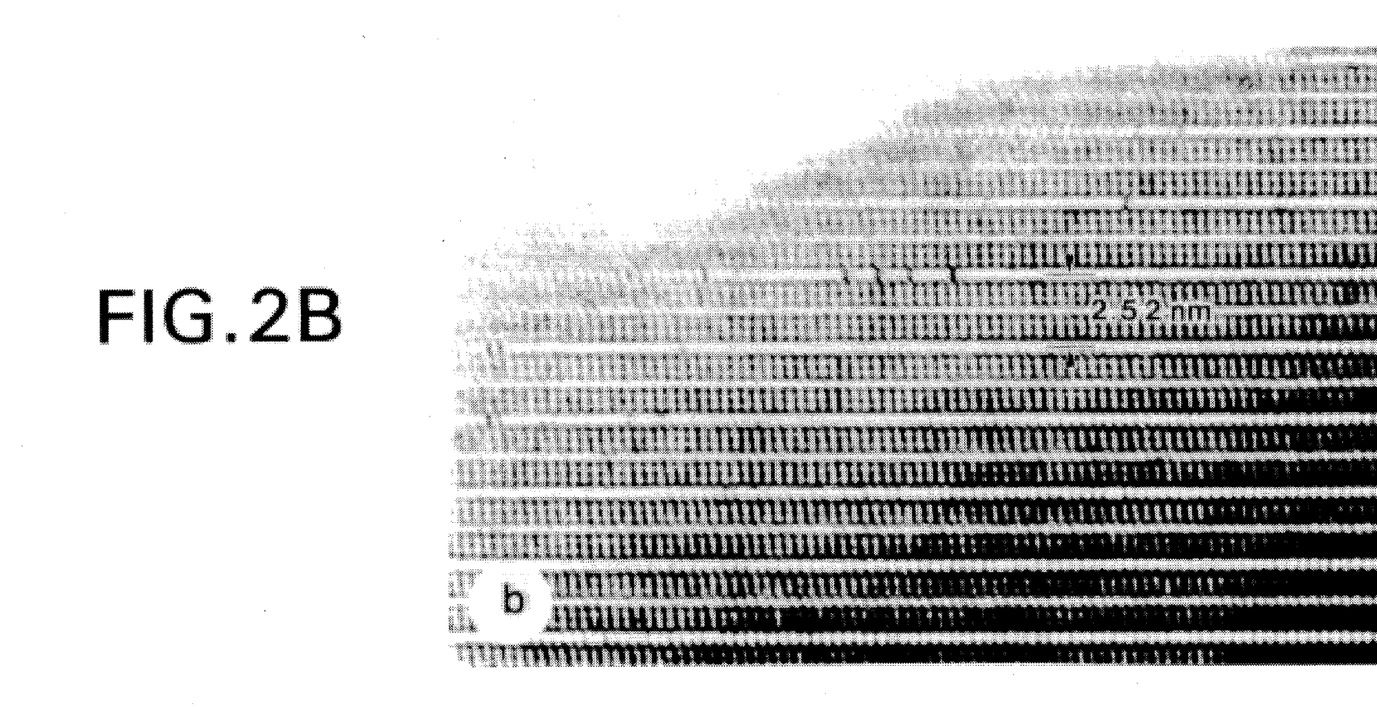

FIG. 2a and FIG. 2b show high resolution electron microscope (HREM) images of $Yb_2Ba_4Cu_7O_x$ present in the sample from the [100] and [010] beam directions, respectively, under the diffracting conditions of FIG. 1a and FIG. 1b. In these images, the darker dots correspond to heavy metal atoms such as Yb and Ba in the thin area.

Figure 2C:
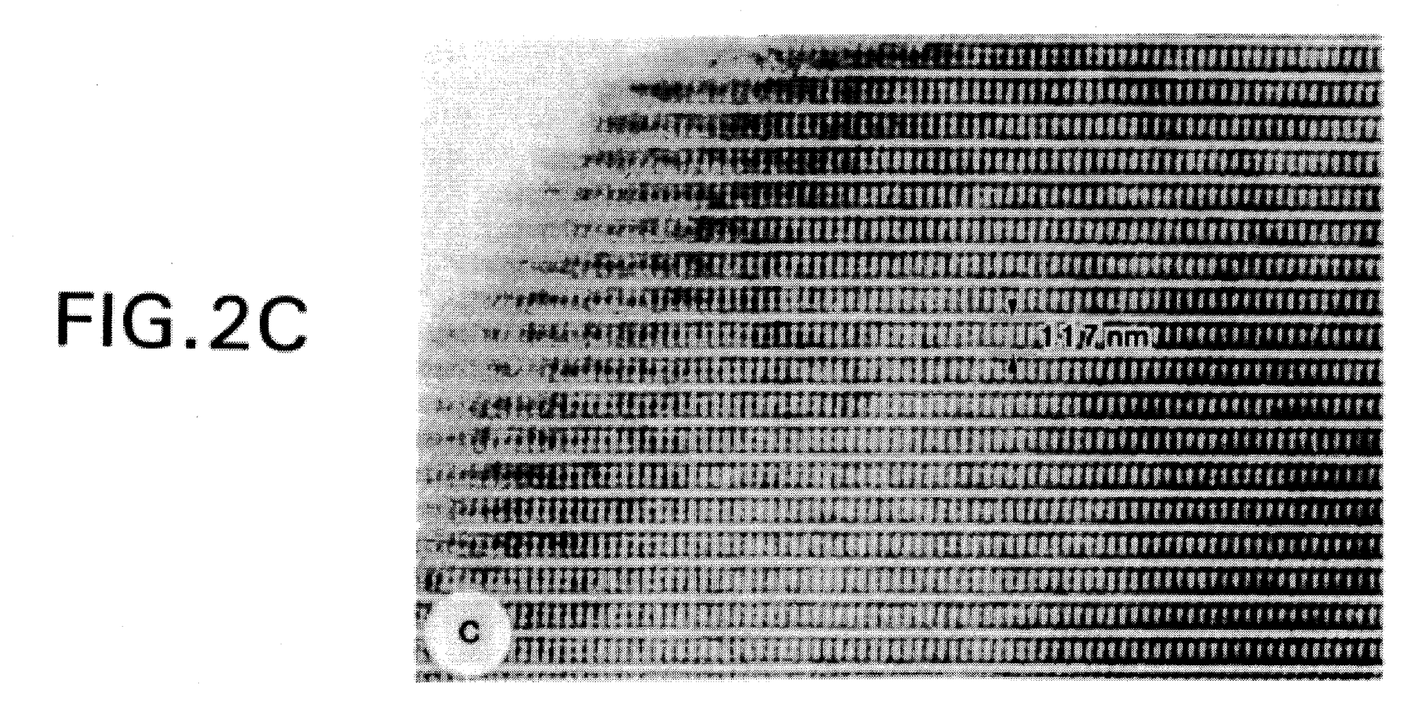
FIG. 2c is a HREM of a $YbBa_2Cu_3O_x$ structure.

FIG. 2c is a HREM of a $YbBa_2Cu_3O_x$ (1-2-3) structure from the [100]/[010] direction. Compared to the 1-2-3 structure, the new structure of FIG. 2a and FIG. 2b has extra CuO layers between groups of two 1-2-3 unit cells at z=0. This is readily apparent as indicated by wider white bands and the shifting of the atoms indicated by dots by the distance b/2 in every group of two 1-2-3 unit cells. Compared to a 2-4-8 structure (not shown), an extra CuO layer is inserted in every 1-2-3 unit cell.

Figures 3A, 3B:
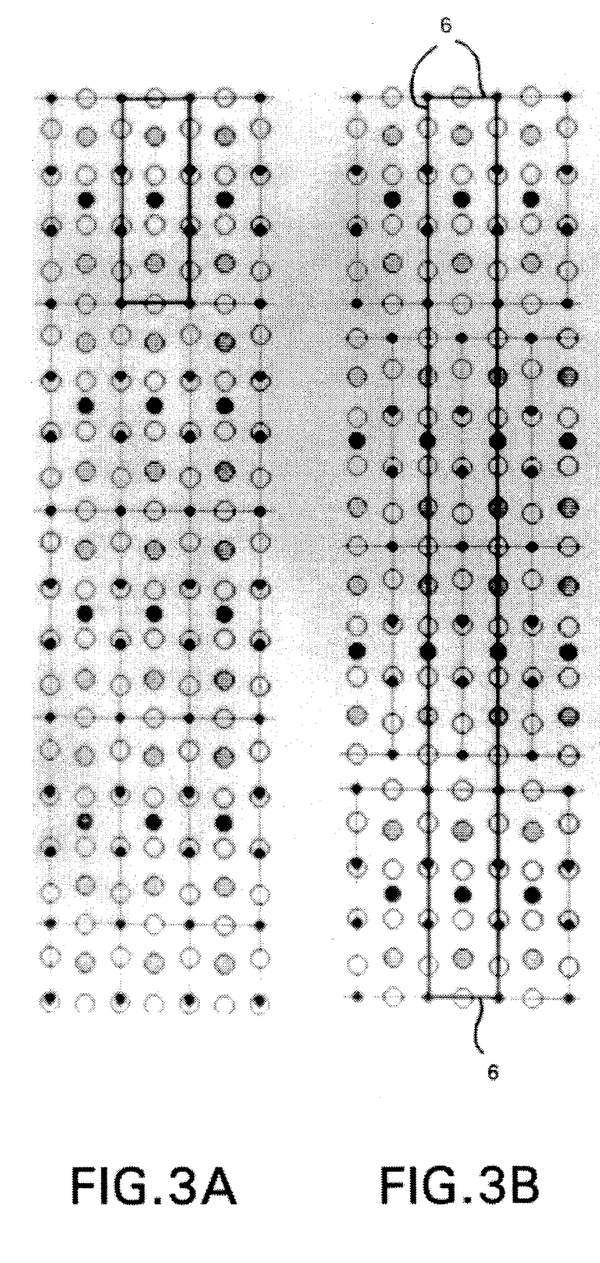
FIGS. 3a, 3b, and 3c are schematic structural models of 1-2-3, 2-4-8, and 2-4-7 structures, respectively.
Figure 3C:
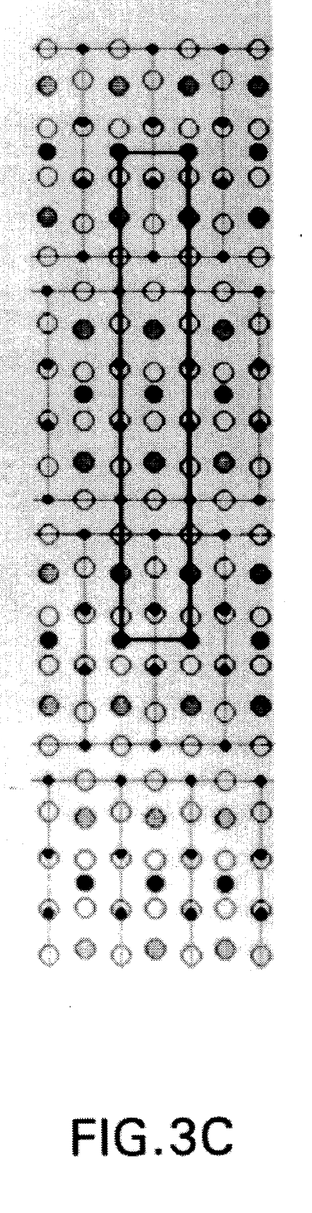

FIGS. 3a, 3b, and 3c illustrate schematically 1-2-3 and 2-4-8 structures, and The novel 2-4-7 structure, respectively. As an extra CuO layer is present in each group of two normal 1-2-3 unit cells, the chemical composition of this structure was determined to be $Yb_2Ba_4Cu_7O_x$, or "2-4-7." This unit cell, shown by bold lines 6 in FIG. 3c, contains two chemical units and is orthorhombic with space group Areram. This is the same space group as a 2-4-8 structure whose c-axis has been lengthened to about 50.4 Å. The contrast at the single and double CuO layers in FIG. 2a and 2b, compared to image simulations (see, e.g., Spence, J. C. H., *Experimental High—Resolution Electron Microscopy*, Clarendon Press, Oxford (1981)), suggests that the CuO layers maintain the same configuration as in the normal 1-2-3 structure. In the 1-2-3 structure, oxygen mainly occupies (0, ½, 0) sites, FIG. 3a. X-ray diffraction measurements, discussed below, confirm this and also indicate that a- and b-axis cell lengths in The 2-4-7 and 1-2-3 phases are identical. In light of these results, the number of oxygens in the novel structure can be denoted $Yb_2Ba_4Cu_7O_{15-\beta}$ where $\beta$ is in the range from 0 to about 1.5. No intergrowth of the 1-2-3 or 2-4-8 structures in 2-4-7 grains have been observed as primary transformation products. This is also consistent with the very sharp, unstreaked diffraction patterns shown in FIG. 1.

It is important to note that the structural illustrations of FIG. 3a, 3b, and 3c are ideal and are not maintained exactly as shown throughout actual crystals. The actual crystal lattice may be twisted or tilted, bonding angles may be variable and ions may not be centered exactly as depicted. As well, localized atomic substitutions may occur. Nevertheless, these figures are representative of the crystals' structure. The present invention of the 2-4-7 compound is therefore not restricted to an embodiment with the precise, non-varying structure illustrated in FIG. 3c and claimed below.

Figure 4:
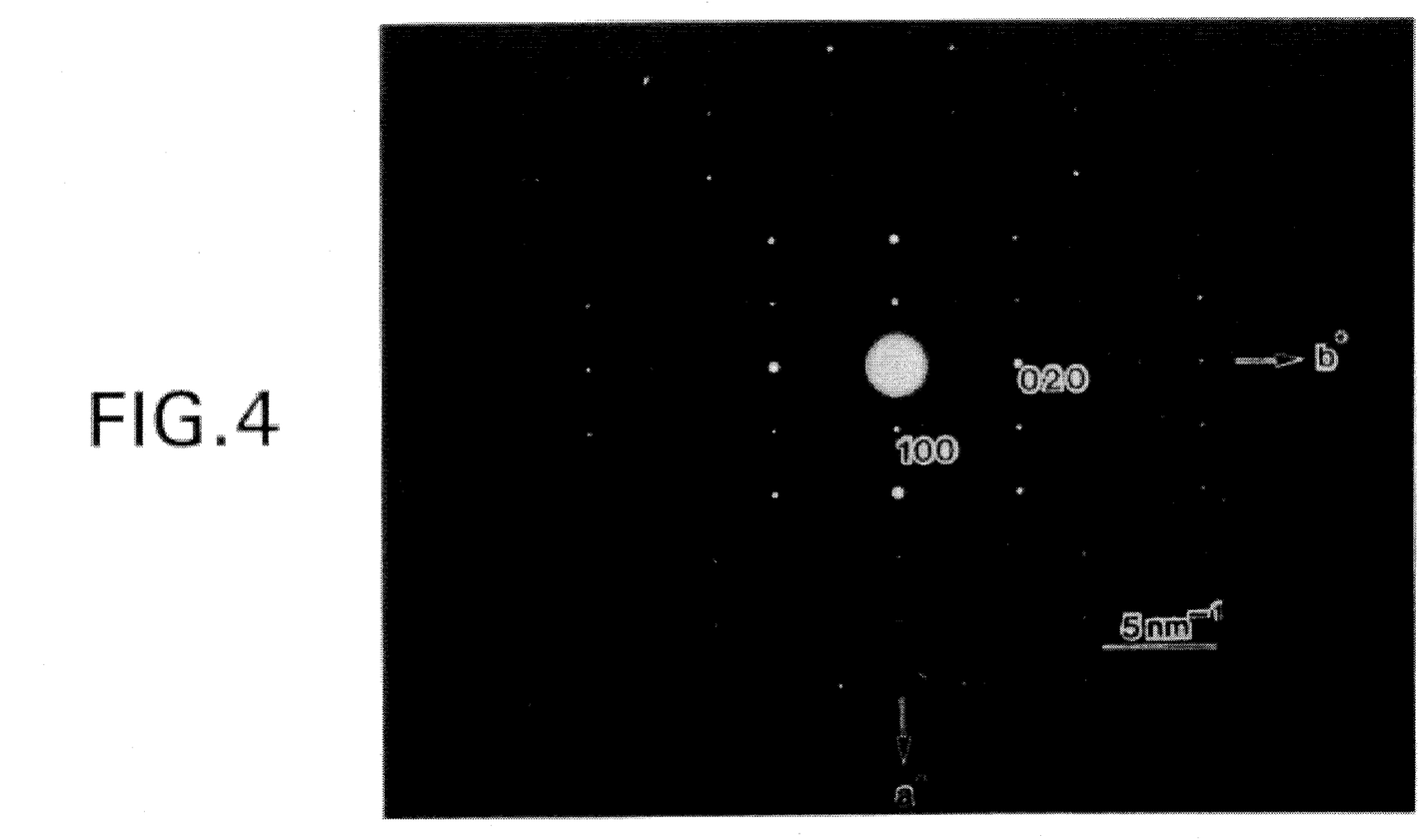
FIG. 4 is an electron diffraction pattern of the 2-4-7 structure.

FIG. 4 is an electron diffraction pattern of the prepared specimen's novel 2-4-7 structure with the beam parallel to the [001] direction. On the hk0 reciprocal plane, the extinction rule is followed and k is even. However, because of the very long c-axis, the diffraction spots on the first and second order Laue zones also appear in this view, complicating the pattern. In the normal 1-2-3 structure, the {110} mirror twins cause the splitting of high order diffraction spots on hk0 planes and the slight difference between the a and b lengths. In the novel 2-4-7 structure, FIG. 4, the absence of such splitting indicates the absence of {110} twins.

Figure 5A:
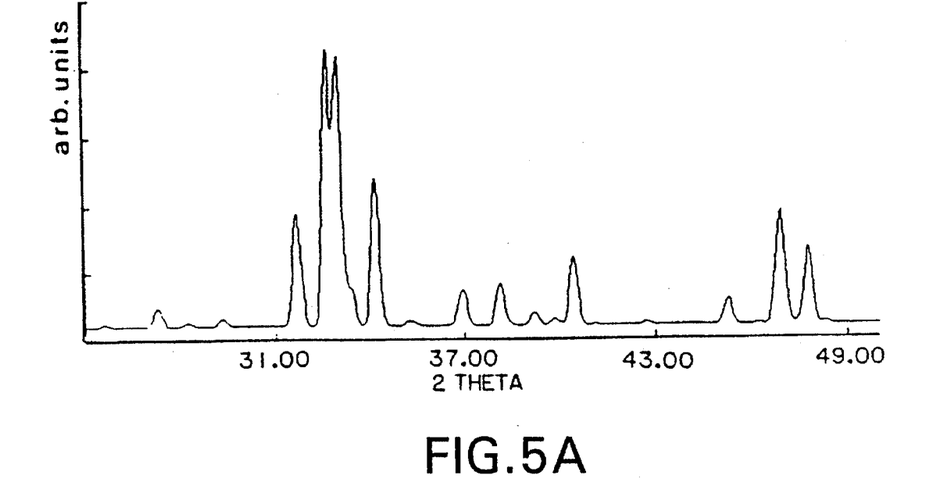
FIGS. 5a and 5b are, respectively, calculated and measured x-ray powder diffraction patterns for the 2-4-7 structure.

Using the structure model of the novel 2-4-7 phase, FIG. 3c, the x-ray diffraction pattern for the structure was calculated, FIG. 5a. The atomic coordinates and temperature factors in the calculation were derived based on the results of David et al., above, for $YBa_2Cu_3O_7$ and on the assumption that the increase in the length of the cell's c-axis caused by an excess CuO layer is 1.9 Å. The peak profile is assumed to be a Gaussian function with a half-width of 0.3 degree. The calculated pattern was compared to the measured x-ray powder diffraction pattern, FIG. 5b. The calculated peaks of FIG. 5a were easily identified in the observed diffraction pattern as indicated by arrows 14 in FIG. 5b. Of special note was the splitting of the main peak and the relatively strong peaks to either side of this main peak. Although a few 1-2-3 grains were identified during electron microscopy, the volume fraction of the 1-2-3 phase was less than about 5% of the total oxide phase based upon careful observation under the electron microscope.

Figure 5B:
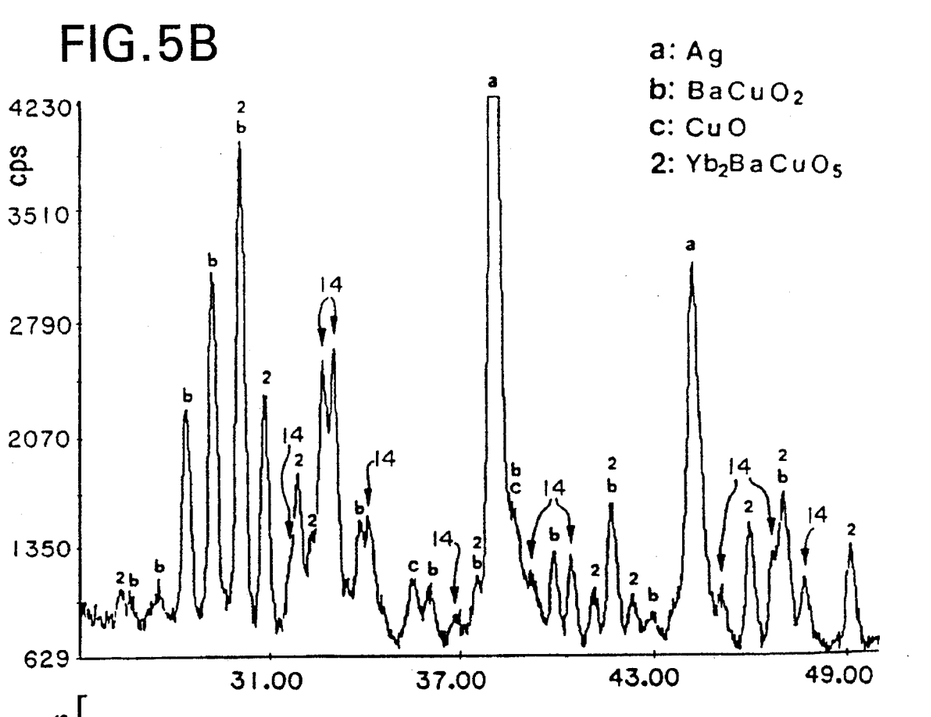

The refined cell parameters of the novel structure using the 2-4-7 peaks observed in FIG. 5b are a=3.809 (5) Å, b=3.861 (9) Å and c=50.45 (7) Å. The a- and b-axis lengths of normal $YbBa_2Cu_3O_x$ in other oxidized metallic precursors (a=3.798 (1) Å; b=3.870 (2) Å) are almost the same as the a- and b-axis lengths in the newly discovered phase. The increase (c=11.660 (3) Å) in the c-axis direction attributed to the additional CuO layer was an estimated 1.905 Å.

In the prepared sample, the volume fractions of $BaCuO_2$, $Yb_2BaCuO_5$ (2-1-1), CuO, and 2-4-7, excluding silver, were estimated as 45%, 20%, 6%, and 29%, respectively. Other samples have been prepared in which the 2-4-7 phase comprised more then 70% of the sample's volume.

One of the key characteristics of a superconducting material is its superconducting critical temperature $T_c$. Analysis showed that the novel 2-4-7 phase exhibited an onset of superconductivity at $T_c$~86° K., with zero resistance at $T_c$~82° K. These results differ from those of other oxidized metal precursors containing high volume fractions of the normal 1-2-3 phase. These other materials show $T_c$ (onset) at about 90°–93° K., with $T_c$ (R=0) at 87°–90° K. As the volume fractions of other superconducting phases was too small to contribute to the sample's measured $T_c$, the data therefore show that the 2-4-7 phase is responsible for the superconductivity in the specimen prepared in the preferred embodiment.

Figure 6:
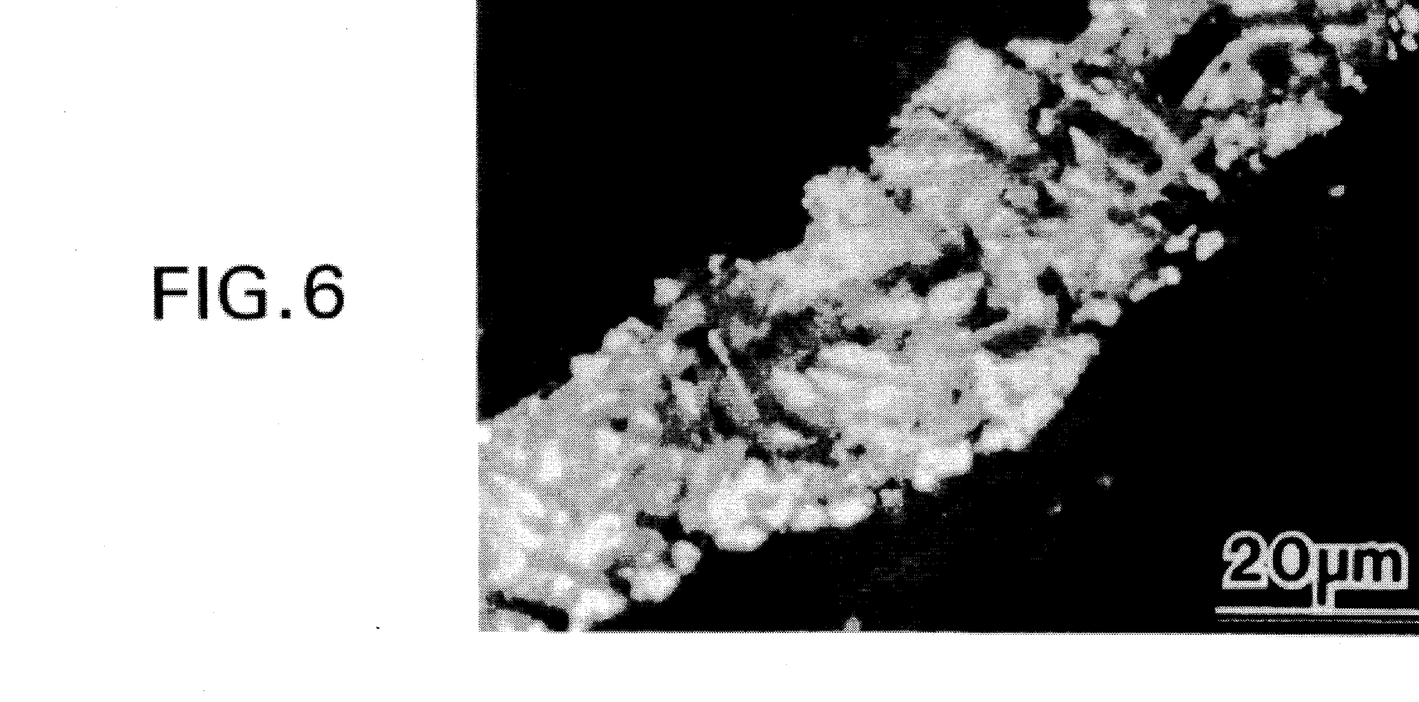
FIG. 6 is a reflection optical micrograph of The specimen prepared according to the preferred embodiment.

FIG. 6 is a reflection optical micrograph of a cross-section of the specimen. The elongated grains are 2-4-7 crystals whose plate-like shapes are about 10–20 µm long and 1–3 µm thick (the c-axis as the "thickness" dimension).

FIG. 6 shows random orientation and intersection of the grains of the 2-4-7 crystal. The intersecting grains create superconducting paths in the ribbons. As a result, the current-carrying capacity of the ribbon is very high. In the samples produced, $J_c$ was greater than 1100 A/cm² at 4.4° K. This current carrying mechanism is advantageous as it may eliminate the need to texture the orientation of the oxide grains in superconducting products so that the grains are oriented in the direction of preferred current flow.

A superconducting article might include the oxide phase in a matrix together with another metal or metals. Such metals could include the noble metals such as gold, silver, platinum, palladium, or iridium, or copper or aluminum or their alloys, or stainless steel. The selection of the matrix metal would depend upon the particular use for the conductor.

Additional features of the specimen prepared in the preferred embodiment include the presence of line defects along beam direction [010]. These defects, indicated by arrows in FIG. 2b, are present at almost every CuO double layer in the relatively thin crystal areas. The faint contrast of some of these features indicated the probable short length of the defects.

In the above embodiment, the starting alloy from which the melt-spun ribbon was formed, before oxidation, had the approximate composition $YbBa_2Cu_3$ with additional silver. Of the oxide phases produced, this yielded about 29% of the novel 2-4-7 structure. By using a $Yb_2Ba_4Cu_7O_{15-x}$ precursor having more Cu, such as the metallic precursor $Yb_2Ba_4Cu_7$, it is expected that a more Cu rich structure will result upon oxidation, yielding a higher percentage of the 2-4-7 superconductor.

It is expected that other elements may be substituted for Yb and Ba in the novel 2-4-7 structure to yield other superconducting compositions. For example, other rare earths such as Y, La, Eu, Gd, Tb, Dy, Ho, Er, Tm and Lu could appear either individually or in combination in the lattice in the sites where Yb was indicated as present in FIG. 3c. Similarly, Ba sites would be partially replaceable or substitutable with Sr and/or Ca; some Ba would be expected to remain in either case. These substitutions would be easily achieved by beginning with a suitable precursor composition that upon oxidation would yield the novel 2-4-7 superconducting composition.

The invention is not limited to the above embodiment, as other embodiments are included within the scope of the claims and their equivalents.

What is claimed is:

1. A composition $R_2Q_yCu_7O_{15-\beta}$ having a perovskite unit cell structure of approximately the following dimensions a=3.8 Å; b=3.9 Å and c=50.5 Å, wherein R is one or more rare earth ions selected from the group consisting of Y, La, Eu, Gd, Tb, Dy, Ho, Er, Tm, Yb and Lu, and wherein Q is one or more alkaline earth metals selected from the group consisting of Ba, Sr and Ca and $\beta$ is in the range of 0 to about 1.5.

2. A composition according to the formula $R_2Q_4Cu_7O_{15-\beta}$ and characterized by having a copper layer inserted after every second 1-2-3 unit cells at z=0, wherein R is a rare earth ion, or a combination of rare earth ions selected from the group consisting of Y, Yb, La, Eu, Gd, Tb, Dy, Ho, Er, Tm, and Lu and wherein Q is one or more alkaline earth metals selected from the group consisting of Ba, Sr and Ca, and $\beta$ is in the range of 0 to about 1.5.

3. A superconducting oxide comprising the composition of claim 1 or 2.

4. A composition according to claim 1 wherein R are Yb or Y and Q are Ba.

5. A superconducting oxide comprising the composition of claim 4.

6. An article capable of carrying current with no resistance comprising a superconducting oxide according to claim 3 and a suitable matrix material.

7. An article according to claim 6 wherein the matrix material is a noble metal, copper, aluminum or stainless steel.

8. An article according to claim 6 wherein the matrix material is gold, silver, or platinum.

9. An article according to claim 6 wherein crystals of the superconducting oxide are randomly oriented and interconnecting to form a continuous superconducting pathway.

10. An article according to claim 6 wherein the superconducting oxide comprises at least 20 volume percent of said composition.

11. A method of preparing a superconducting oxide $R_2Q_4Cu_7O_x$ wherein R is a rare earth ion, or a combination of rare earth ions selected from the group consisting of Y, La, Eu, Gd, Tb, Dy, Ho, Er, Tm, Yb and Lu and Q is one or more alkaline earth metals selected from the group consisting of Ba, Sr and Ca, comprising oxidizing a R-Q-Cu-Ag metallic precursor starting alloy in oxygen, said oxidizing comprising heating the alloy to about 500° C., holding the alloy at about 500° C. for a first period, heating the oxidized alloy to about 900° C., holding the alloy at about 900° C. for a second period sufficient to form the superconducting oxide, cooling the superconducting oxide to about 500° C., holding the superconducting oxide at about 500° C. for a third period and cooling the superconducting oxide to ambient temperature.

12. A method according to claim 11, wherein said heating and cooling is at the rate of 10° to 30° C. per minute.

13. A method according to claim 11 wherein the first and third periods are about 10 hours and the second period is about 100 hours.

14. A method according to claim 11 wherein the starting alloy has the approximate composition $RQ_2Cu_3$ with 33 weight percent silver, wherein R is Yb and Q is Ba.

15. A method according to claim 11 wherein the starting alloy has the approximate composition $R_2Q_4Cu_7$ with 33 weight percent silver, wherein R is Yb and Q is Ba.

16. A composition in accordance with claim 1 wherein said composition exhibits superconductivity at a temperature of 82° K.

17. A composition in accordance with claim 2 wherein said composition exhibits superconductivity at a temperature of 82° K.

18. An article in accordance with claim 6 which exhibits superconductivity at a temperature of 82° K.

19. An article in accordance with claim 7 which exhibits superconductivity at a temperature of 82° K.

20. An article in accordance with claim 8 which exhibits superconductivity at a temperature of 82° K.

21. An article in accordance with claim 9 which exhibits superconductivity at a temperature of 82° K.

22. An article in accordance with claim 10 which exhibits superconductivity at a temperature of 82° K.

23. A composition which exhibits superconductivity at a temperature of 82° K.,
    said composition having the formula
    $R_aQ_bCu_cO_{15-B}$ wherein:
    a=about 2, b=about 4, c=about 7, B=0 to about 1.5,
    R is one or more rare earth ions selected from the group consisting of Y, La, Eu, Gd, Td, Dy, Ho, Er, Tm, Yb, and Lu,
    Q is one or more alkaline earth metals selected from the group consisting of Ba, Sr and Ca.

24. A composition in accordance with claim 4 wherein said composition exhibits superconductivity at a temperature of 82° K.

* * * * *